US010163835B2

(12) United States Patent
Yang et al.

(10) Patent No.: US 10,163,835 B2
(45) Date of Patent: Dec. 25, 2018

(54) SOLDER BUMP STRETCHING METHOD

(71) Applicant: TAIWAN SEMICONDUCTOR MANUFACTURING COMPANY, LTD., Hsinchu (TW)

(72) Inventors: Su-Chun Yang, Hsinchu County (TW); Yi-Li Hsiao, Hsinchu (TW); Chih-Hang Tung, Hsinchu (TW); Chen-Hua Yu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/837,403

(22) Filed: Dec. 11, 2017

(65) Prior Publication Data
US 2018/0108632 A1    Apr. 19, 2018

Related U.S. Application Data

(63) Continuation of application No. 14/554,354, filed on Nov. 26, 2014, now Pat. No. 9,842,817, which is a
(Continued)

(51) Int. Cl.
*H01L 21/44*    (2006.01)
*H01L 23/00*    (2006.01)
(Continued)

(52) U.S. Cl.
CPC ............ *H01L 24/11* (2013.01); *B23K 1/0016* (2013.01); *H01L 21/78* (2013.01); *H01L 24/16* (2013.01);
(Continued)

(58) Field of Classification Search
CPC .................................. H01L 24/11; H01L 24/15
(Continued)

(56) References Cited

U.S. PATENT DOCUMENTS 3,921,285 A    11/1975  Krall
4,878,611 A    11/1989  LoVasco et al.
(Continued)

FOREIGN PATENT DOCUMENTS

JP    2-206138    8/1990
JP    11-111764    4/1999
(Continued)

OTHER PUBLICATIONS

Office Action dated Jun. 5, 2014 and English translation from corresponding No. KR 10-2013-0073073.
(Continued)

*Primary Examiner* — Lex Malsawma
*Assistant Examiner* — Eric W Jones
(74) *Attorney, Agent, or Firm* — Hauptman Ham, LLP

(57) ABSTRACT

A wafer-level pulling method includes securing a top holder to a plurality of chips. The method further includes securing a bottom holder to a wafer, wherein the plurality of chips are bonded to the wafer by a plurality of solder bumps. The method further includes softening the plurality of solder bumps. The method further includes stretching the plurality of softened solder bumps, wherein stretching the plurality of softened solder bumps comprises leveling the plurality of chips using a plurality of levelling devices separated from the plurality of chips, and a first levelling device of the plurality of levelling devices has a different structure from a second levelling device of the plurality of levelling devices.

20 Claims, 20 Drawing Sheets

Related U.S. Application Data continuation-in-part of application No. 13/826,362, filed on Mar. 14, 2013, now Pat. No. 9,475,145, which is a continuation-in-part of application No. 13/406,198, filed on Feb. 27, 2012, now abandoned.

(51) Int. Cl.
*H01L 21/78* (2006.01)
*B23K 1/00* (2006.01)
*H01L 25/065* (2006.01)
*H01L 25/00* (2006.01)

(52) U.S. Cl.
CPC ............ *H01L 24/742* (2013.01); *H01L 24/75* (2013.01); *H01L 24/81* (2013.01); *H01L 24/97* (2013.01); *H01L 25/0652* (2013.01); *H01L 25/50* (2013.01); *H01L 24/13* (2013.01); *H01L 24/94* (2013.01); *H01L 25/0655* (2013.01); *H01L 25/0657* (2013.01); *H01L 2224/1132* (2013.01); *H01L 2224/1134* (2013.01); *H01L 2224/1145* (2013.01); *H01L 2224/1183* (2013.01); *H01L 2224/1184* (2013.01); *H01L 2224/11334* (2013.01); *H01L 2224/11462* (2013.01); *H01L 2224/11848* (2013.01); *H01L 2224/131* (2013.01); *H01L 2224/13014* (2013.01); *H01L 2224/13111* (2013.01); *H01L 2224/13139* (2013.01); *H01L 2224/13147* (2013.01); *H01L 2224/16057* (2013.01); *H01L 2224/16058* (2013.01); *H01L 2224/16145* (2013.01); *H01L 2224/16225* (2013.01); *H01L 2224/16227* (2013.01); *H01L 2224/16506* (2013.01); *H01L 2224/16507* (2013.01); *H01L 2224/7598* (2013.01); *H01L 2224/75252* (2013.01); *H01L 2224/75317* (2013.01); *H01L 2224/75501* (2013.01); *H01L 2224/75502* (2013.01); *H01L 2224/75744* (2013.01); *H01L 2224/75745* (2013.01); *H01L 2224/75843* (2013.01); *H01L 2224/8193* (2013.01); *H01L 2224/81121* (2013.01); *H01L 2224/81191* (2013.01); *H01L 2224/81815* (2013.01); *H01L 2224/94* (2013.01); *H01L 2224/97* (2013.01); *H01L 2225/06513* (2013.01); *H01L 2924/00013* (2013.01); *H01L 2924/01322* (2013.01); *H01L 2924/12042* (2013.01)

(58) Field of Classification Search
USPC ......... 438/612, 613; 257/778, 779; 228/101, 228/125
See application file for complete search history.

(56) References Cited

U.S. PATENT DOCUMENTS

| | | | |
|---|---|---|---|
| 5,142,117 A | 8/1992 | Hoggatt et al. | |
| 5,148,968 A | 9/1992 | Schmidt et al. | |
| 5,222,014 A | 6/1993 | Lin | |
| 5,441,195 A | 8/1995 | Tustaniwskyj et al. | |
| 5,964,396 A | 10/1999 | Brofman et al. | |
| 5,968,670 A | 10/1999 | Brofman et al. | |
| 5,975,409 A | 11/1999 | Brofman et al. | |
| 5,982,038 A * | 11/1999 | Toy | H01L 23/10 257/772 |
| 6,427,901 B2 | 8/2002 | Dautartas | |
| 6,550,665 B1 | 4/2003 | Parrish et al. | |
| 6,551,863 B2 * | 4/2003 | Johnson | H01L 21/283 228/180.1 |
| 6,633,021 B2 | 10/2003 | Matubara | |
| 6,890,795 B1 | 5/2005 | Wong et al. | |
| 7,014,094 B2 | 3/2006 | Alcoe | |
| 8,236,606 B2 | 8/2012 | Lee | |
| 8,317,077 B2 | 11/2012 | Hwang et al. | |
| 8,381,965 B2 | 2/2013 | Jang et al. | |
| 2002/0070460 A1* | 6/2002 | Uchida | B23K 3/0669 257/780 |
| 2004/0217470 A1 | 11/2004 | Takano | |
| 2005/0014313 A1 | 1/2005 | Workman et al. | |
| 2005/0062169 A1 | 3/2005 | Dubin et al. | |
| 2005/0098610 A1 | 5/2005 | Onobori et al. | |
| 2006/0263929 A1 | 11/2006 | Matsunami | |
| 2007/0099412 A1 | 5/2007 | Miyazaki | |
| 2007/0181644 A1* | 8/2007 | Ueno | H01L 24/81 228/101 |
| 2008/0035274 A1 | 2/2008 | Kanisawa et al. | |
| 2008/0158843 A1 | 7/2008 | So et al. | |
| 2009/0229853 A1 | 9/2009 | Fukuda | |
| 2009/0294409 A1 | 12/2009 | Ho et al. | |
| 2010/0093131 A1* | 4/2010 | Maeda | B23K 1/0016 438/107 |
| 2010/0203353 A1 | 8/2010 | Anderson et al. | |
| 2010/0327043 A1 | 12/2010 | Nakamura et al. | |
| 2012/0045869 A1 | 2/2012 | Gaynes et al. | |

FOREIGN PATENT DOCUMENTS

| | | |
|---|---|---|
| JP | 2001-332583 | 11/2001 |
| JP | 2007506284 | 3/2007 |
| TW | 201137963 | 11/2011 |

OTHER PUBLICATIONS

David, E. M. et al., "Solid Logic Technology: Versatile, High-Performance Microelectronics," IBM Journal, Apr. 1964, pp. 102-114.
Rajoo, R., et al., "Super Stretched Solder Interconnects for Wafer Level Packaging," Electronic Components and Technology Conference, 2006, pp. 1227-1232.
Wang, Yiwei et al., "Effect of Sn Grain Structure on Electromigration Reliability of Pb-Free Solders," Electronic Components and Technology Conference, 2011, pp. 711-716.
Notice of Allowance dated Jan. 18, 2017 and English translation from corresponding application No. KR 10-2016-0025707.
Office Action dated May 3, 2016 and English translation from corresponding application No. KR 10-2016-0025707.
Office Action dated Jul. 21, 2015 and English translation from corresponding application No. KR 10-2013-0073073.
Office Action dated Jun. 17, 2015 from corresponding No. TE 102102788.
Office Action dated Dec. 2, 2014 and English translation from corresponding No. KR 10-2013-0073073.

* cited by examiner

SOLDER BUMP STRETCHING METHOD

PRIORITY CLAIM

The present application is a continuation of U.S. application Ser. No. 14/554,354, filed Nov. 26, 2014, which is continuation-in-part of U.S. application Ser. No. 13/826,362, filed Mar. 14, 2013, now U.S. Pat. No. 9,475,145, issued Oct. 25, 2016 which is a continuation-in-part priority of U.S. application Ser. No. 13/406,198, filed Feb. 27, 2012, the disclosures of which are hereby incorporated herein by reference in its entirety.

TECHNICAL FIELD

The present disclosure relates generally to an integrated circuit and more particularly to a solder bump.

BACKGROUND

Solder bumps, used in flip-chip solder joints for example, are usually assembled by aligning and placing a chip on a substrate, then reflowing the solder bumps in a conveyer oven. The grain orientation of the solder bump element, e.g., Sn, could not be controlled, and the reflowed solder joint has random grain orientation. Depending on the local grain orientation around a joint between a solder bump and a conductive pad or an under bump metal (UBM), early failure may occur at the joint due to solder material dissolution caused by, for example, electromigration (EM).

BRIEF DESCRIPTION OF THE DRAWINGS

Reference is now made to the following descriptions taken in conjunction with the accompanying drawings, in which.

DETAILED DESCRIPTION

Figure 1A:
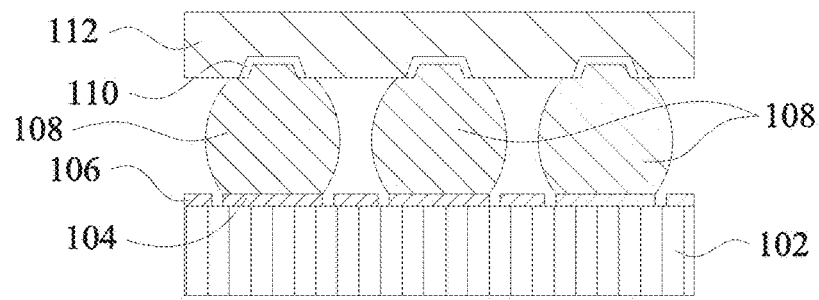
FIGS. 1A-1E are cross-sectional views of an exemplary solder bump at various intermediate steps of a solder bump stretching process according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity of identification of corresponding objects and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIGS. 1A-1E are cross-sectional views of an exemplary solder bump at various intermediate steps of a solder bump stretching process according to some embodiments. In FIG. 1A, a substrate 102 is joined with a top die 112 after a reflow process of the solder bumps 108. The substrate 102 is shown with pads 104 for electrical connections using solder bumps 108. The substrate 102 provides support for the electrical connections to a top die 112 through the solder bumps 108. The substrate 102 can be, for example, a silicon substrate, an interposer, another die, or a printed circuit board (PCB). The pads 104 formed over the substrate 102 comprise electrically conductive material, such as metal (copper, aluminum, etc.).

A solder mask 106 disposed over the substrate 102 provides a protective coating, e.g., for the copper traces on the substrate 102, and prevents solder bumps 108 from bridging conductors, thereby preventing short circuits. The solder mask 106 can be liquid photo-imageable solder mask (LPSM) or dry film photo-imageable solder mask (DFSM), and comprises epoxy, or a lacquer-like layer of polymer in some embodiments.

The solder bumps 108 disposed over the substrate 102 and pads 104 can be micro bumps, ball grid array (BGA) solder balls, or any other suitable solder structure. For example, some micro bumps has a diameter of about 2 μm-120 μm, and some BGA solder balls has a diameter of about 100 μm-500 μm in some embodiments. The solder bumps 108 comprise solder materials such as Sn, Ag, Cu, any combination there of, or any other suitable material.

Solder bumps 108 can be formed or placed on under bump metal (UBM) 110 in many ways, including evaporation, electroplating, printing, jetting, stud bumping, direct placement, or any other suitable method. The UBM 110 facilitates soldering using solder bumps 108 for electrical connections to the top die 112. The pads 104, solder mask 106, solder bumps 108, and UBM 110 can be fabricated using any suitable processes and/or materials known in the art.

Figure 1B:
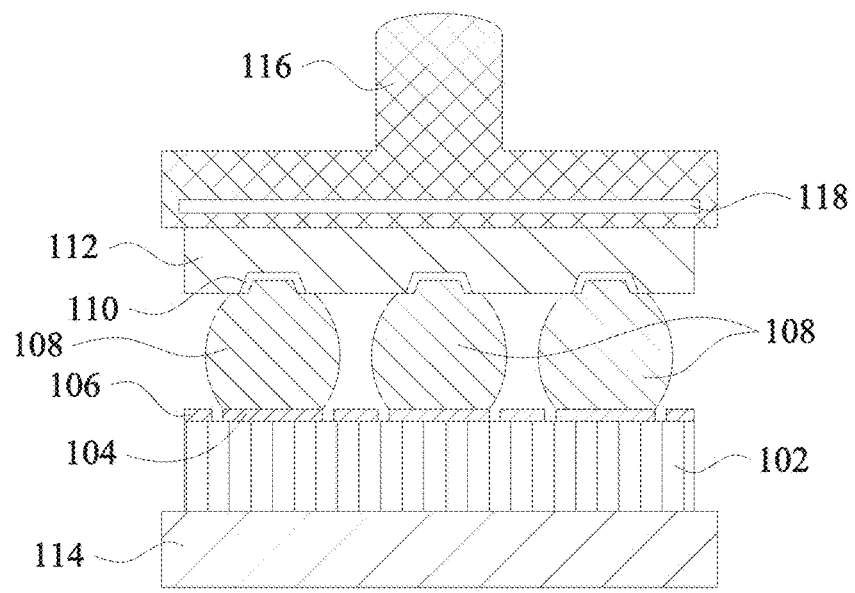

In FIG. 1B, the package including the substrate 102 and the top die 112 is then placed in a thermal compression bonder (TCB). The top holder (i.e., bonder head) 116 of the TCB is bonded to the top die 112 above the solder bumps 108 and a bottom holder 114 of the TCB is bonded to the substrate 102 below the solder bumps 108. The bonding of the top holder 116 and the top die 112 and the bonding of the bottom holder 114 and the substrate 102 can be performed by vacuum suction, for example. Then the solder bumps 108 are heated above the melting temperature of the solder bumps 108 by using a heat element 118 in the top holder 116. In one example, the solder bumps 108 are heated above 300° C. The heat element 118 can be an electrical wire, for example. In some embodiments, the heating temperature is above the melting point of the solder used. In some embodiments, the temperature profile can be controlled separately on the two sides of the solder bumps 108, and/or by leaving the bottom holder 114 at a room temperature.

Figure 1C:
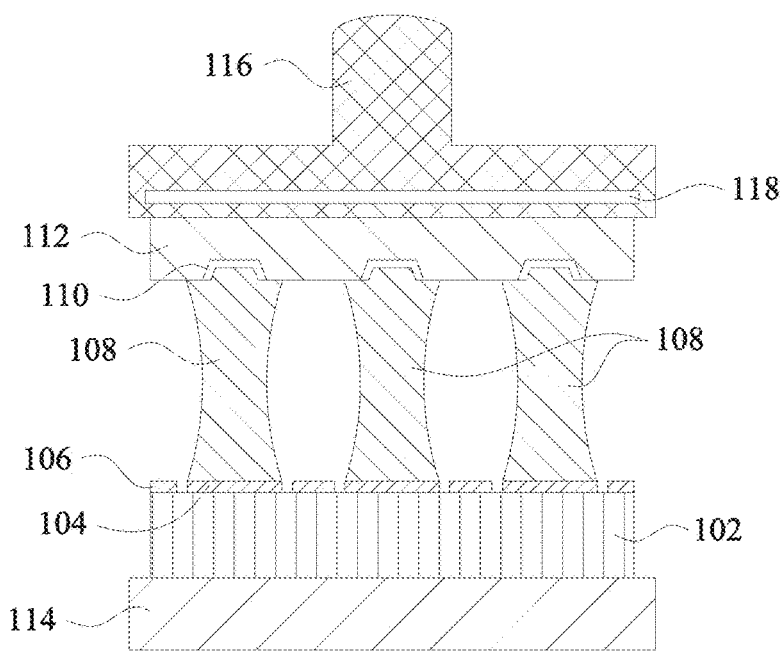

In FIG. 1C, the top holder 116 and the bottom holder 114 of the TCB are used to pull the top die 112 to a controlled height, and the shape of molten solder bumps 108 is simultaneously changed. The solder bumps 108 are stretched to manipulate and change the shape, height, and microstructure, e.g., to increase the height of the solder bumps 108. Even though the top holder 116 and the bottom holder 114 of the TCB are used to stretch the solder bump 108 to increase its height, any other suitable method can be used in other embodiments.

Figure 1D:
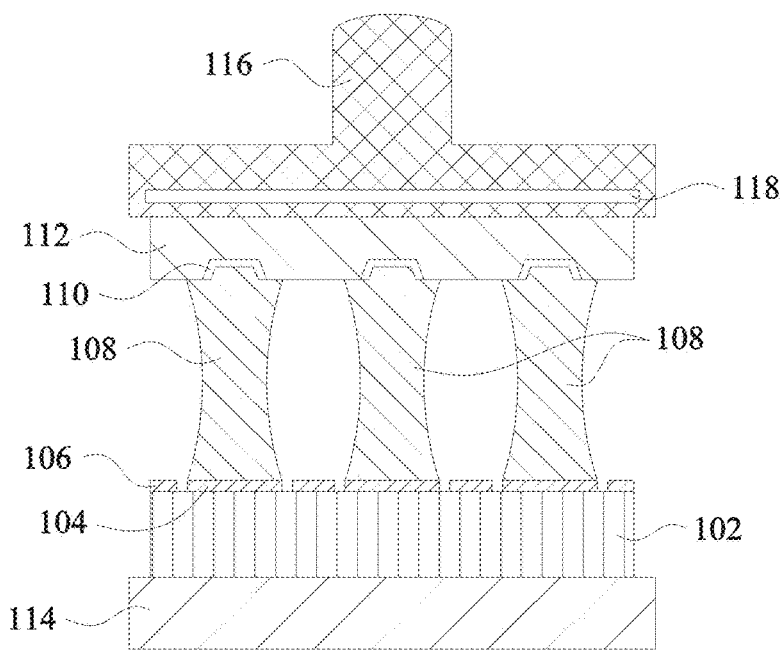
Figure 1E:
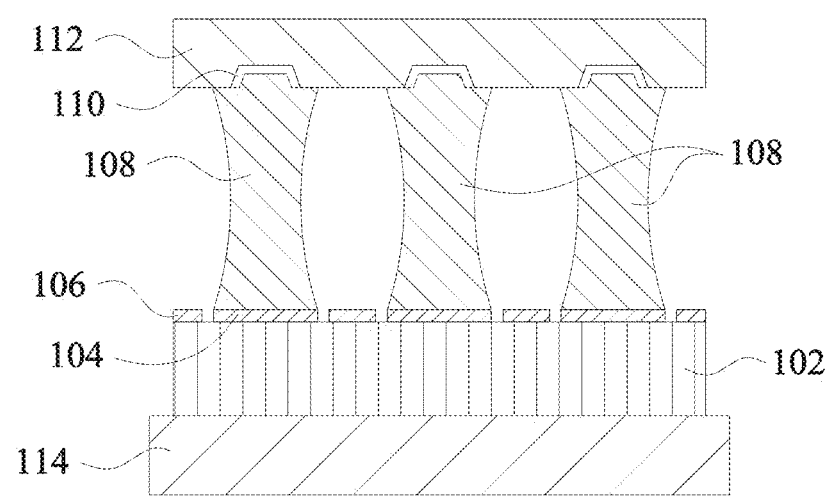

In FIG. 1D, the heat in the top holder 116 is stopped or removed to allow the solder bumps 108 to solidify. The solder bumps 108 are allowed to cool down in a controlled manner. In one example, the solder bumps 108 are cooled down at a room temperature. In FIG. 1E, the top holder 116 and the bottom holder 114 are removed.

Figure 2:
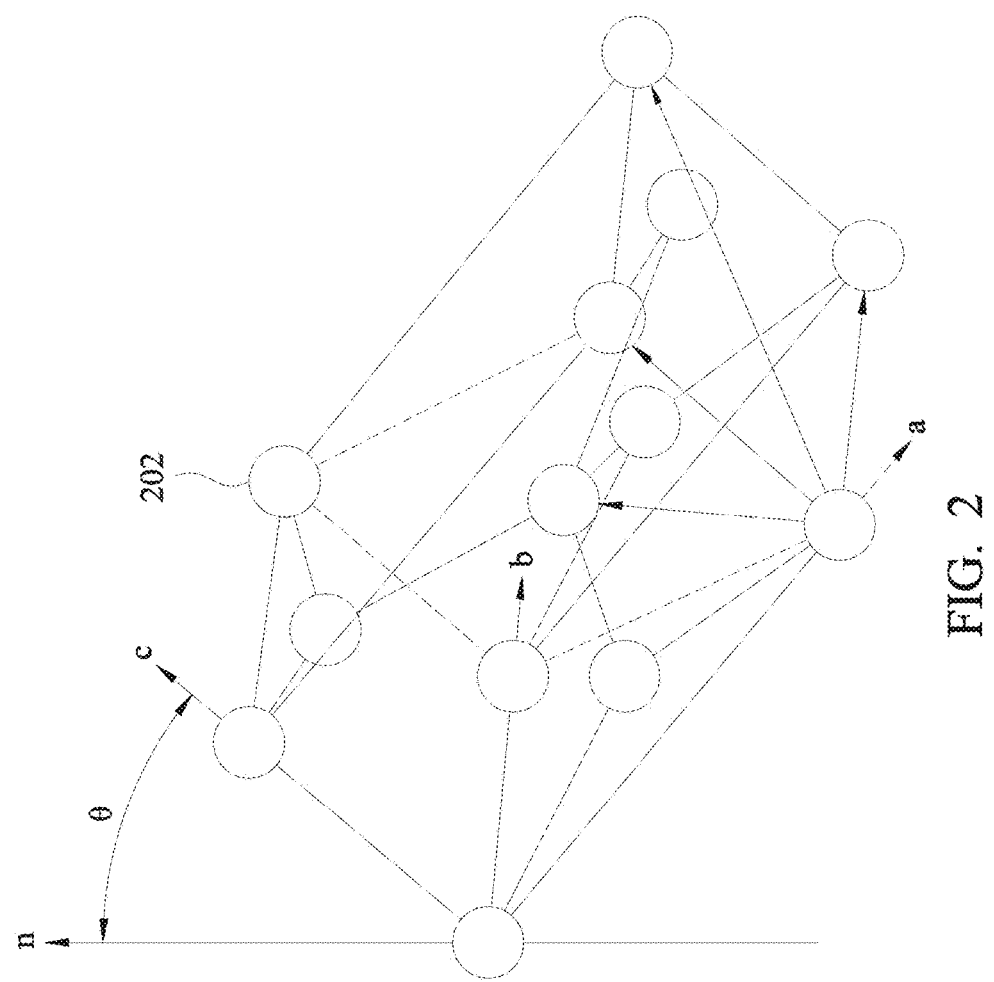
FIG. 2 is a diagram of grain orientation angle of an exemplary solder bump element crystal such as Sn.

After the stretching process in FIGS. 1A-1E, solder bumps 108 have an increased grain orientation angle. FIG. 2 is a diagram of the grain orientation angle of an exemplary solder bump element crystal such as β-Sn. As shown in FIG. 2, the grain orientation angle θ is the angle between the short crystal axis (c-axis) of the main element 202 (of the solder bumps 108 in FIGS. 1A-1E) and the normal n-axis (of the substrate 102 or of the pad 104 in FIGS. 1A-1E), which is the current flow direction. Long crystal axis, i.e., a-axis and b-axis, are also shown in FIG. 2 for references.

The n-axis can be considered as the current flow direction, and a small grain orientation angle θ between the c-axis and the n-axis can facilitate a fast atomic migration and result in an earlier EM failure. In some embodiments, the main element of the solder bumps 108 is Sn and the increased orientation angle after the stretching process in FIGS. 1A-1E is above 50°. A microanalysis technique such as Electron Backscatter Diffraction (EBSD) can be used with electron microscopes to determine the crystal structure of the sample and estimate the grain orientation angle.

Figure 3:
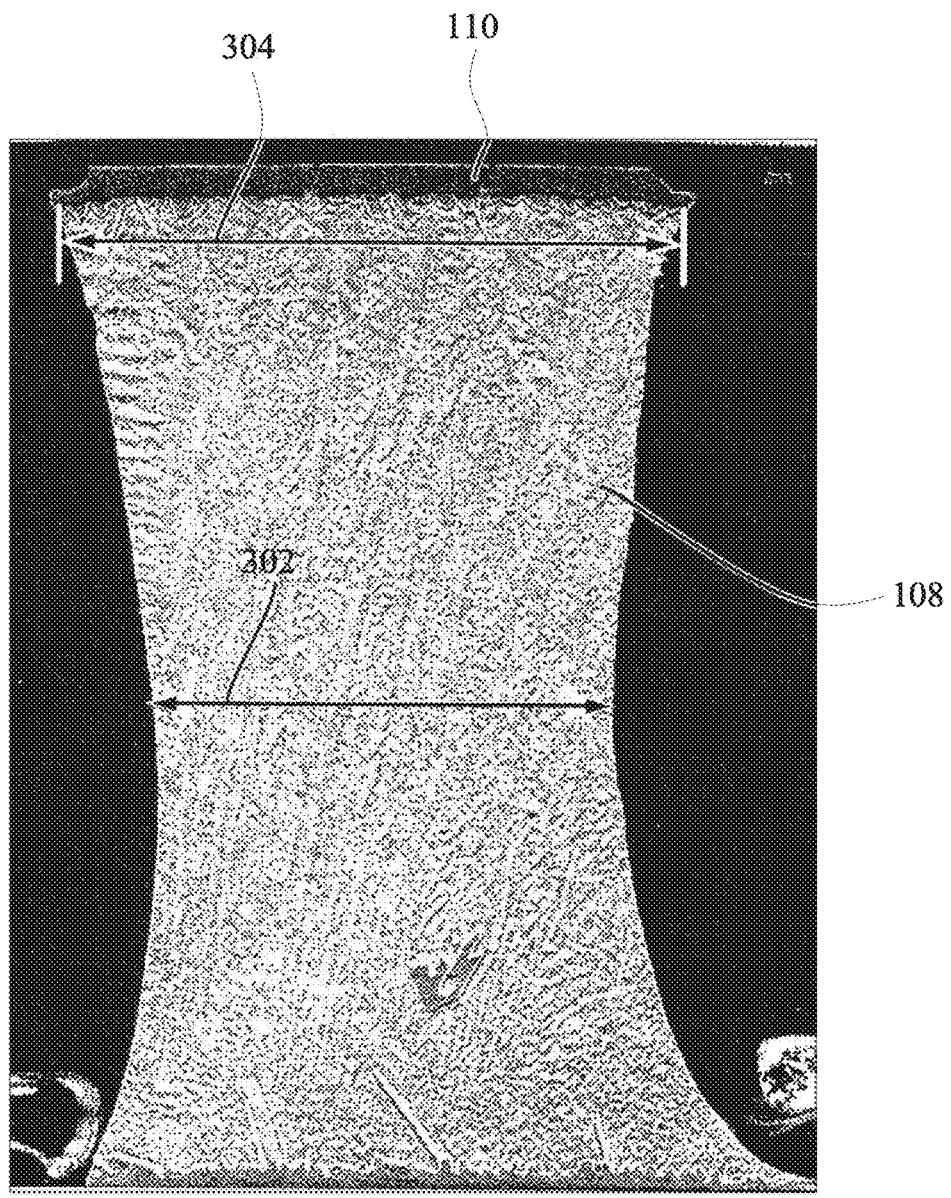
FIG. 3 is a scanning electron microscope (SEM) micrograph of an exemplary cross-sectioned solder bump stretched by the process in FIGS. 1A-1E according to some embodiments.

FIG. 3 is a picture of an exemplary solder bump 108 stretched by the process in FIGS. 1A-1E according to some embodiments. The ratio of the center width 302 of the solder bump 108 over the top contact width 304 of the solder bump 108 is from 0.6 to 1.0 after the stretching in some embodiments. In one example, a solder bump 108 having a height of about 160 μm is stretched to the height of about 260 μm and the ratio of the center width 302 (about 170 μm) over the top contact width 304 (about 240 μm) is about 0.7.

Also, the solder bump 108 has an increased portion of a lamellar structure (a thin plate or pillar-like structure) after the stretching process, as shown in FIG. 3. The lamellar structure can reduce crack propagation because the grain boundaries are close to vertical relative to a horizontal crack propagation direction. In FIG. 3, coarse dendrites are also observed. Even though an hour-glass shape (having a longer top width than the center width) is shown in FIG. 3, different shapes are possible, including column or cylinder-shape, a barrel shape, or ball shape, etc., by using different solder volume or different controlled stretching height.

The stretching process described in FIGS. 1A-1E can also improve thermal mechanical reliability of solder bump joints. The increased height and/or the hour-glass shape in some embodiments effectively reduce the strain in the solder bumps 108. In some exemplary embodiments, the fatigue life of solder bumps 108 using the stretching method in FIGS. 1A-1E was enhanced up to 4-5 times compared to solder bumps 108 without stretching.

Figure 4A:
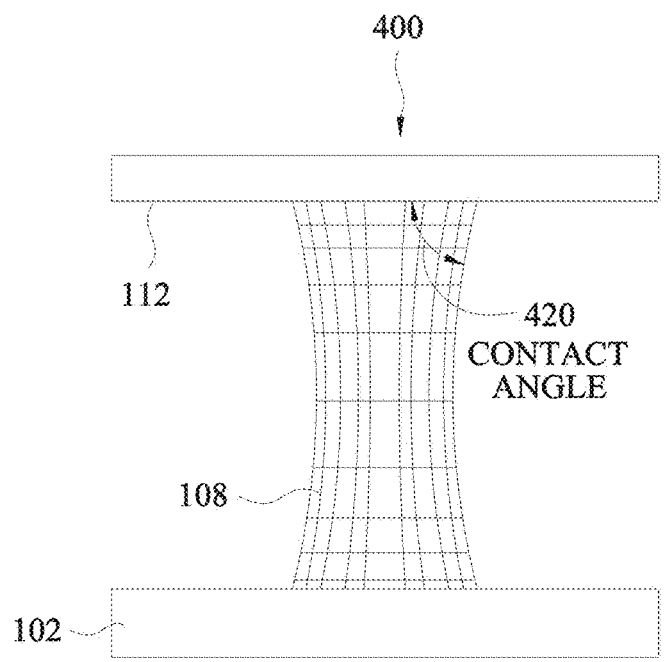
FIGS. 4A-4D are side views of an exemplary solder bump at various intermediate steps of a solder bump stretching process to form a solder bump joint in an electrical device according to some embodiments.
Figure 4B:
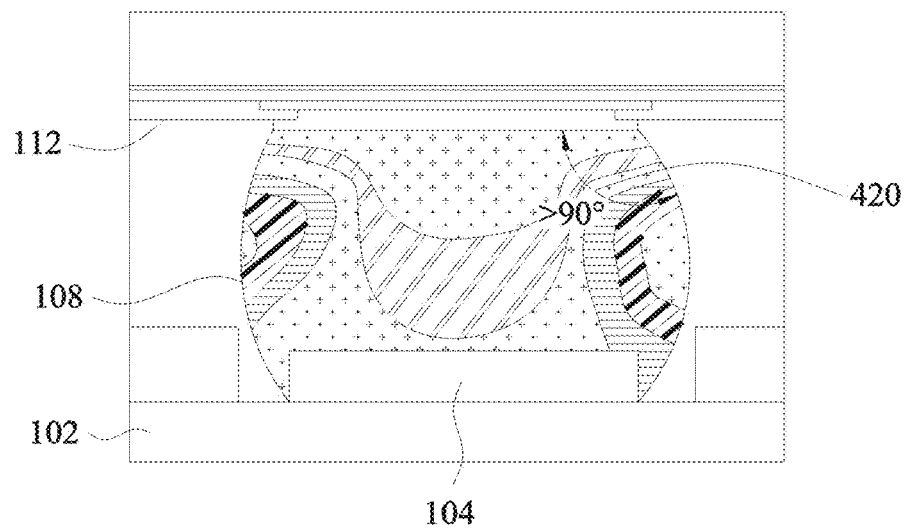
Figure 4C:
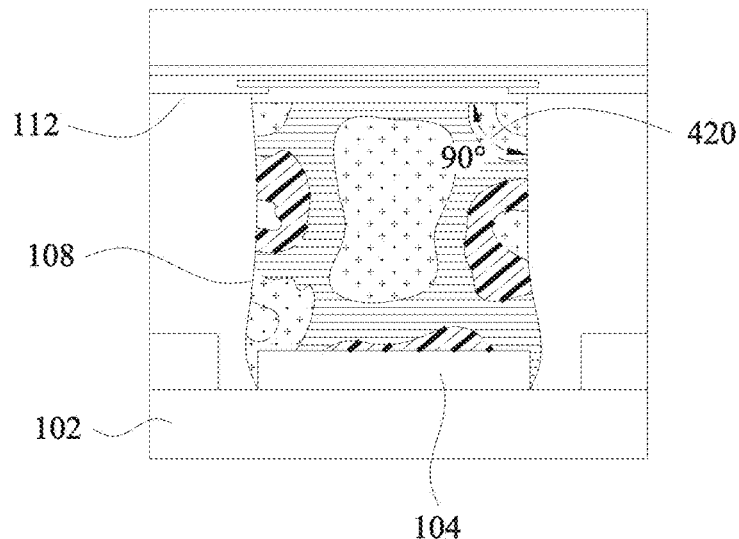
Figure 4D:
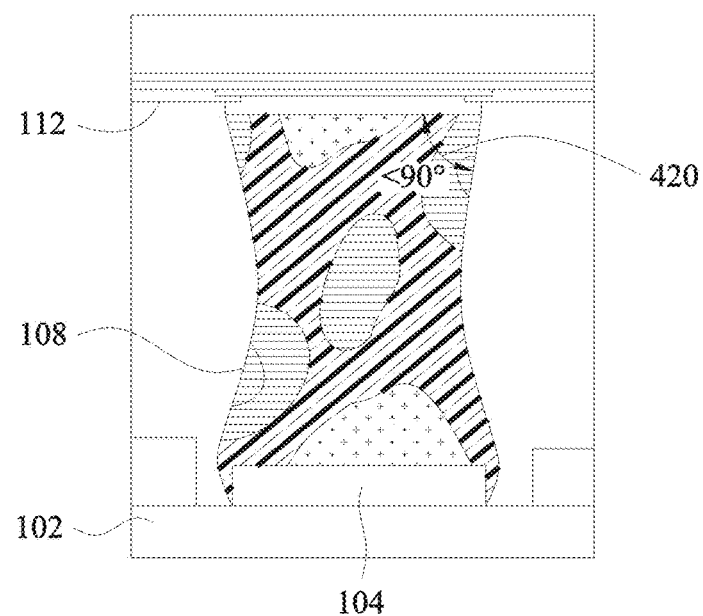

FIGS. 4A-4D are side views of an exemplary solder bump 400 at various intermediate steps of a solder bump stretching process to form a solder bump joint in an electrical device according to some embodiments. The substrate 102 is jointed with the top die 112 after a reflow process of a single solder bump 108. In FIG. 4A, a contact angle 420 is an angle encompassed by the solder bump 108 as measured between the top die 112 and an outer surface of solder bump 108, in some embodiments. In other embodiments, the contact angle 420 is an angle encompassed by a solder bump 108 as measured between the pad 104 (see FIGS. 4B-4D) on the substrate 102 and the outer surface of solder bump 108. The contact angle is measured from points equidistant from a common vertex where solder bump 108 and top die 112 or pad 104 meet. The substrate 102 supports a single pad 104 for electrical connection using solder bump 108. For example, in FIG. 4B, the contact angle 420 between the top die 112 and the outer surface of solder bump 108 is greater than 90°. In FIG. 4C, the contact angle 420 between the top die 112 and the outer surface of solder bump 108 is equal to 90°. In FIG. 4D, the contact angle 420 between the top die 112 and the outer surface of solder bump 108 is less than 90°.

Figure 5A:
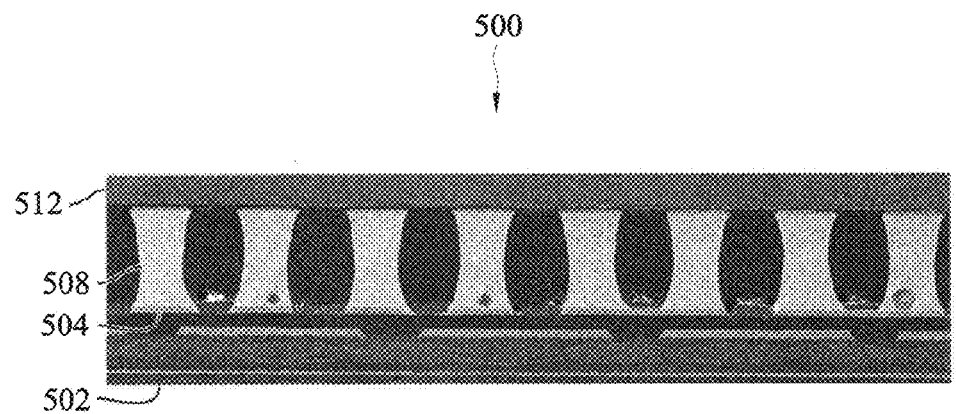
FIGS. 5A and 5B are SEM micrographs of exemplary solder bumps stretched by the process in FIGS. 1A-1E according to some embodiments.
Figure 5B:
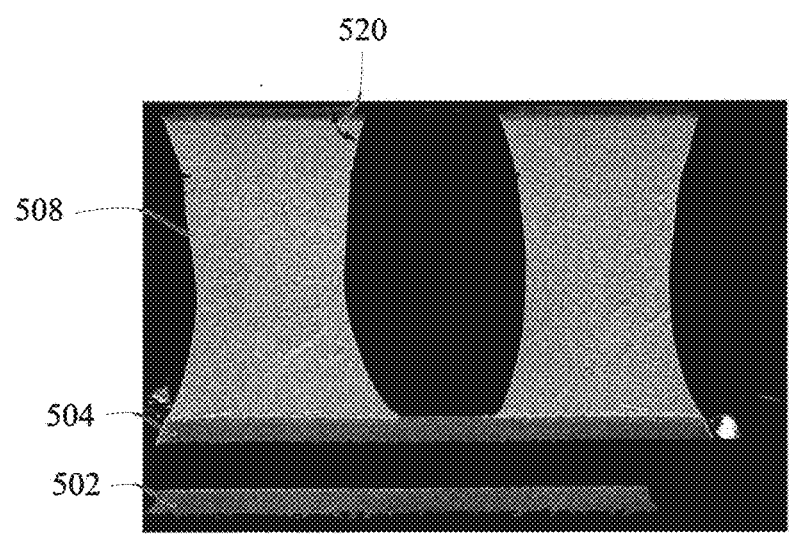

FIGS. 5A and 5B are scanning electron microscope (SEM) micrographs of exemplary solder bumps stretched by the process in FIGS. 1A-1E according to some embodiments. A coupled electronic structure 500 includes solder bumps 508 disposed between pads 504 supported by a substrate 502 and a top die 512. For clarity, FIG. 5B is an expanded portion of FIG. 5A, having a contact angle 520 of less than 90°. In some embodiments, the contact angle 520 varies depending on the configuration of the pads 504, quantity of solder used to form the solder bumps 508 and a distance between the pads 504 and the top die 512. In some embodiments, the surface finish of pads 504 is at least one of copper (Cu), silver (Ag), electroless nickel immersion gold (ENIG) and electroless nickel electroless palladium immersion gold (ENEPIG).

Figure 6A:
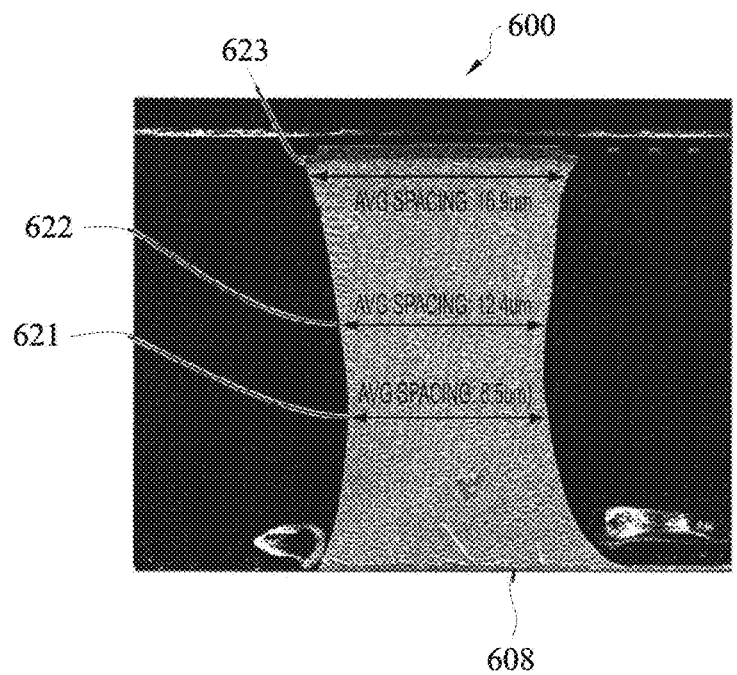
FIGS. 6A and 6B are SEM micrographs of cross-sectioned portions of an exemplary solder bump stretched by the process in FIGS. 1A-1E according to some embodiments.
Figure 6B:
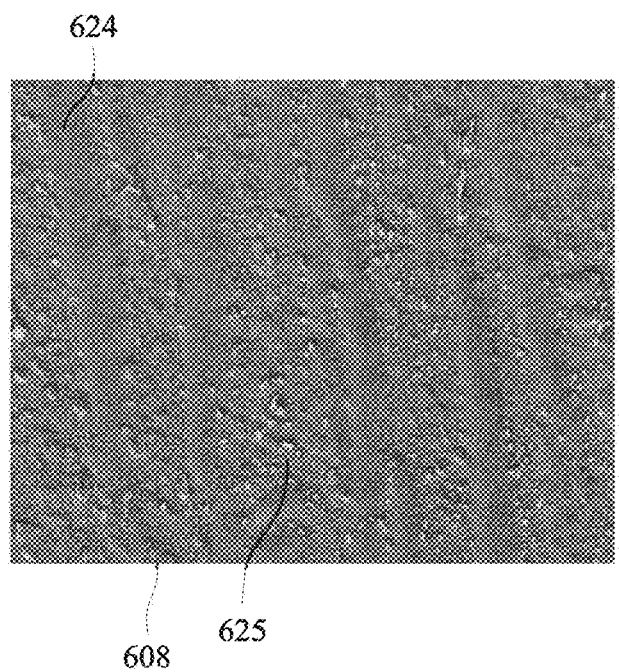

FIGS. 6A and 6B are SEM micrographs 600 of cross-sectioned portions of an exemplary solder bump stretched by the process in FIGS. 1A-1E according to some embodiments. The SEM micrograph of FIG. 6A was taken by a scanning electron microscope (SEM) from a cross-sectioned solder bump 608. The cross-sectioned solder bump 608 has an average center width spacing 621 of 8.5 micrometers (μm), an average middle width spacing 622 of 12.4 μm and an average top contact width spacing 623 of 16.9 μm. The SEM micrograph 600 of FIG. 6B was taken at increased magnification as compared to FIG. 6A. In some embodiments, the solder bump 608 is a eutectic alloy that includes beta crystal phase (β) tin (Sn) 624 and beta crystal phase (β) tin (Sn) with copper (Cu) and silver (Ag) 625. In some embodiments the β-Sn with Cu and Ag 625 is β-Sn+$Cu_6Sn_5$+$Ag_3Sn$.

Referring to both FIG. 6A and FIG. 6B, the solder bump 608 forms an elongated solder bump joint between the substrate 102 and top die 112 as shown in FIGS. 4A-4D. In various embodiments the solder bump 608 includes one or more of Sn—Cu, Sn—Ag, Sn—Ag—Cu, Sn-zinc (Zn), or Sn-bismuth (Bi). More solder combinations are also envisioned in other embodiments, some of which include nickel (Ni) and/or gold (Au). In SEM micrographs 600, a darker-appearing lamellar structure is a Sn-rich phase greater than 90% Sn and a lighter-appearing lamellar structure is Sn plus various intermetallic compounds (IMCs). In some embodiments the IMC is at least one of $Cu_6Sn_5$, $Ag_3Sn$, $Ni_3Sn_4$ and $AuSn_4$.

Figure 7:
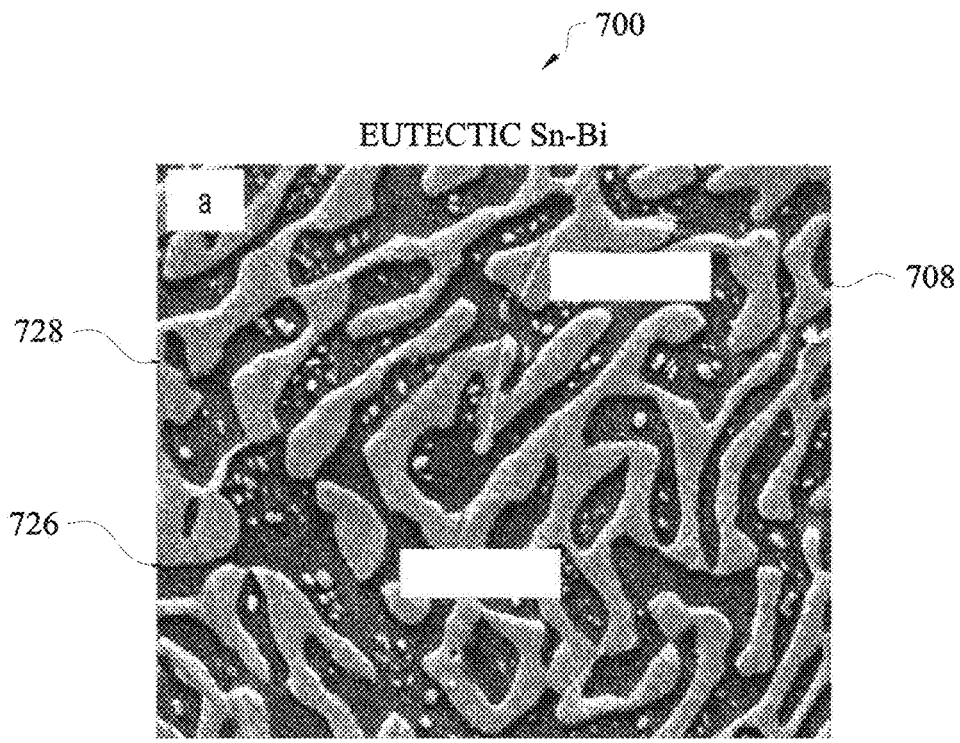
FIG. 7 is an SEM micrograph of a cross-sectioned portion of another exemplary solder bump stretched by the process in FIGS. 1A-1E according to some embodiments.

FIG. 7 is an SEM micrograph 700 of a cross-sectioned portion of another exemplary solder bump 708 stretched by the process in FIGS. 1A-1E according to some embodiments. The solder bump 708 is a lead-free eutectic alloy of tin (Sn) and bismuth (Bi). In the SEM micrograph 700, a darker-appearing lamellar structure is a Sn-rich phase 726 and a lighter-appearing lamellar structure is a Bi-rich phase 728.

Figure 8:
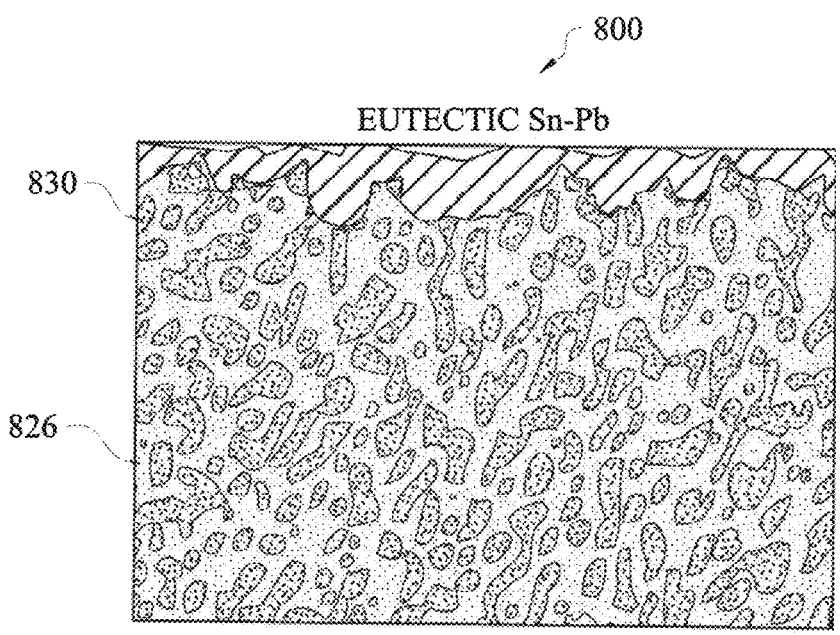
FIG. 8 is an SEM micrograph of a cross-sectioned portion of yet another exemplary solder bump stretched by the process in FIGS. 1A-1E according to some embodiments.

FIG. 8 is an SEM micrograph 800 of a cross-sectioned portion of yet another exemplary solder bump 808 stretched by the process in FIGS. 1A-1E according to some embodiments. The solder bump 808 contains lead and thus is not a lead-free eutectic alloy of tin (Sn) and lead (Pb). In the SEM micrograph 800, a darker-appearing lamellar structure is a Sn-rich phase 826 and a lighter-appearing lamellar structure is a Pb-rich phase 830.

Figure 9A:
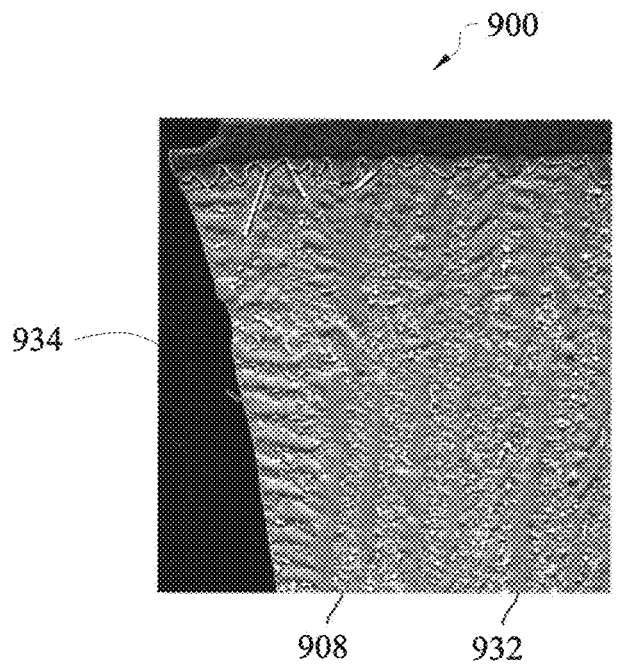
FIGS. 9A and 9B are SEM micrographs of cross-sectioned portions of still other exemplary solder bumps stretched by the process in FIGS. 1A-1E according to some embodiments.
Figure 9B:
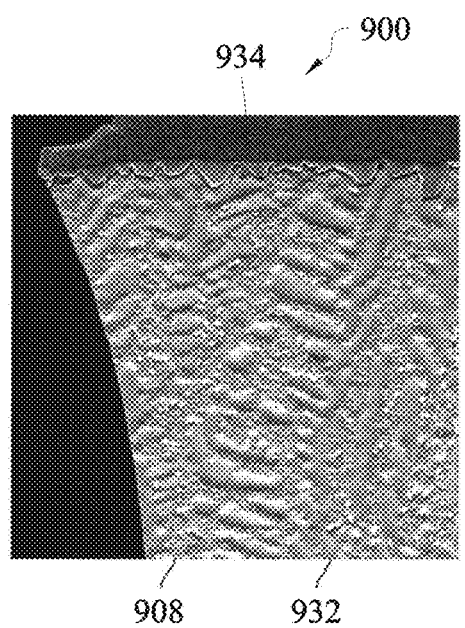

FIGS. 9A and 9B are SEM micrographs 900 of cross-sectioned portions of still other exemplary solder bumps 908 stretched by the process in FIGS. 1A-1E according to some embodiments. The solder bumps 908 contain one or more sets of lamellar structure. In some embodiments, the solder bumps 908 contain predominantly orthogonal lamellar structure 932 that is predominantly orthogonal to the pads 104 and predominantly parallel to an axis of stretching of the solder bumps 908. In some embodiments, the solder bumps 908 contain predominantly parallel lamellar structure 934 that is predominantly parallel to the pads 104 and predominantly orthogonal to the axis of stretching of the solder bumps 908. Both the predominantly orthogonal lamellar structure 932 and the predominantly parallel lamellar structure 934 are present in some embodiments. Other lamellar structure in different orientations exists in other embodiments.

Figure 10:
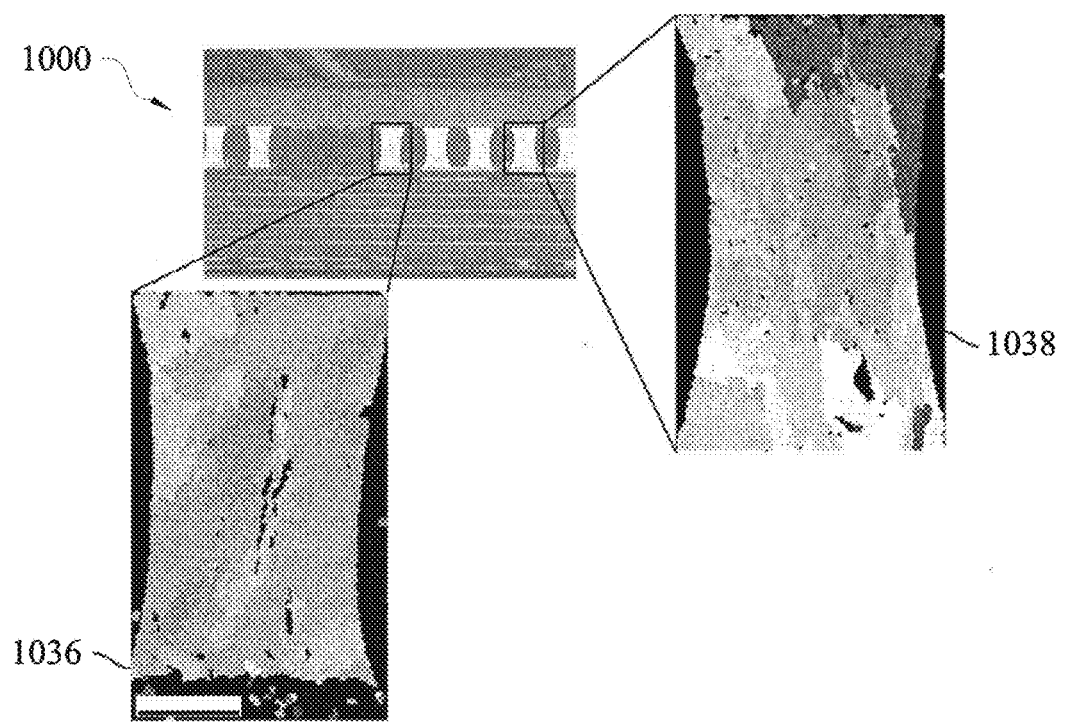
FIG. 10 is an SEM micrograph having first and second expanded portions of other cross-sectioned solder bumps stretched by the process in FIGS. 1A-1E according to some embodiments.

FIG. 10 is an SEM micrograph 1000 having first and second expanded portions of other cross-sectioned solder bumps stretched by the process in FIGS. 1A-1E according to some embodiments. The SEM micrograph 1000 includes structure corresponding to the structure in FIG. 5A, the description of which is similarly applicable and not repeated here. The SEM micrograph 1000 further includes a first expanded portion of a single solder bump 1036 and a second expanded portion of another solder bump 1038. The first expanded portion 1036 and the second expanded portion 1038 have differently shaded portions corresponding to different solder bump crystal orientations.

Figure 11:
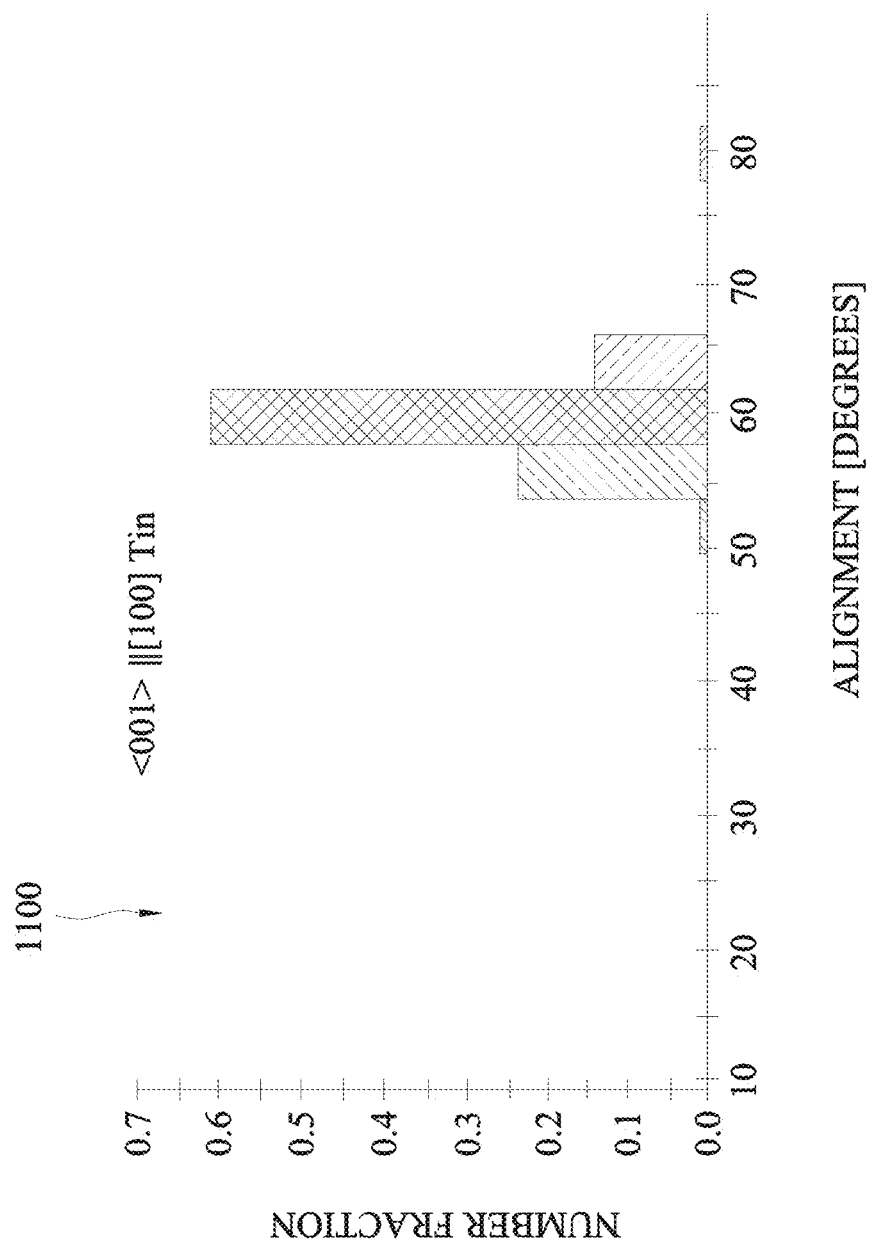
FIG. 11 is a graph of percentage versus alignment in degrees for a solder bump having different crystal grain orientations corresponding to the first expanded portion of FIG. 10.

FIG. 11 is a graph 1100 of a percentage (known here as a number of fraction) versus alignment in degrees for a solder bump having different crystal grain orientations corresponding to the first portion 1036 of FIG. 10. The alignment in degrees on the x-axis of the graph 1100 is identified in FIG. 2 as angle θ. Solder bump crystal grain orientations are grouped into four columns ranging from between slightly less than 50° to just over 65° followed by a gap and a fifth column centered near 80°. The column that includes 60 degrees has the greatest percentage of any column in FIG. 11. Lamellar crystal structure having an angle θ greater than 45° is predominantly orthogonal to an axis of stretching of the solder bump 108. Lamellar crystal structure having an angle θ less than 45° is predominantly parallel to the axis of stretching of the solder bump 108. The pattern of columns in the graph 1100 indicates the process in some embodiments result in a more ordered predominantly orthogonal crystal structure. The solder bump 108 forms a solder bump joint with c-axis orthogonal with the axis of stretching to mitigate early electromigration (EM) failure in the electrical device.

Figure 12:
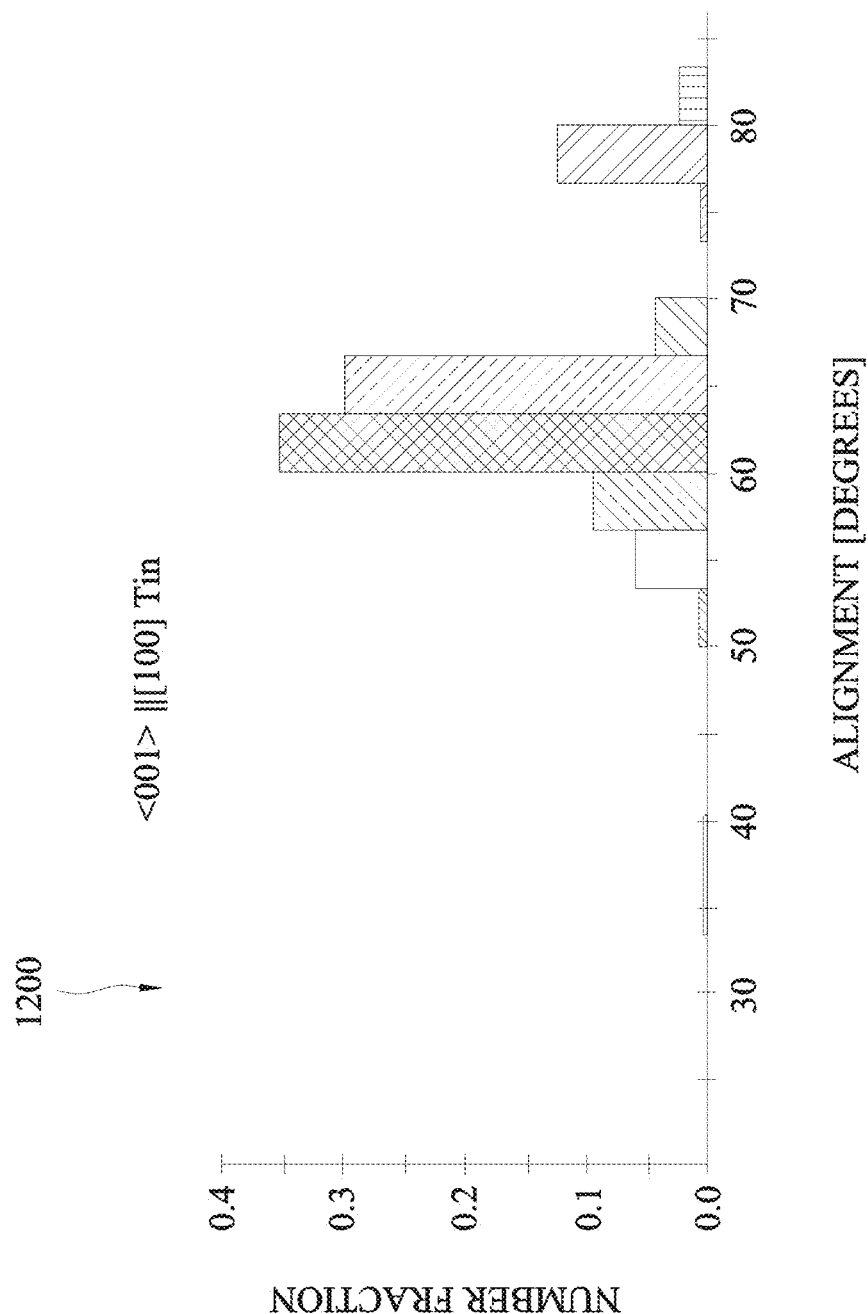
FIG. 12 is a graph of percentage versus alignment in degrees for another solder bump having different crystal grain orientations corresponding to the second expanded portion of FIG. 10.

FIG. 12 is a graph of number of a percentage (known here as a number of fraction) versus alignment in degrees for another solder bump having crystal grain orientation corresponding to the second portion 1038 of FIG. 10. Similar to FIG. 11, the alignment in degrees on the x-axis of the graph 1200 is identified in FIG. 2 as angle θ. Solder bump crystal grain orientations are shown in 11 different columns with a column that includes 62° having the greatest percentage of any column in FIG. 12. Similar to FIG. 11, the pattern of columns in the graph 1200 indicates the process in some embodiments result in a more ordered predominantly orthogonal crystal structure.

According to some embodiments, a solder bump, and stretching method for forming the solder bump, produces a novel lamellar crystal structure in the resulting solder bump joint that mitigates or eliminates premature electromigration (EM) failure by creating a solder bump joint with a preferred crystal orientation of a variety of Sn alloy grains, including at least one of Sn—Cu, Sn—Ag, Sn—Ag—Cu, Sn—Zn, Sn—Bi and Sn—Pb. While a method is disclosed that employs heating, stretching and cooling for forming the lamellar crystal structure in the resulting solder bumps, other embodiments use other means of stretching the solder joint to produce an aligned lamellar crystal structure with a preferred orientation.

According to some embodiments, a method includes heating a solder bump above a melting temperature of the solder bump. The solder bump is stretched to increase the height of the solder bump. The solder bump is cooled down.

According to some embodiments, a method of producing a solder bump joint includes heating a solder bump including tin above a melting temperature of the solder bump. The solder bump is stretched to increase the height of the solder bump. The solder bump is cooled down.

According to some embodiments, a device having a solder bump joint between a substrate having pads and a top die, includes solder bumps. The solder bumps are positioned between the pads on the substrate having pads and the top die. The solder bumps form the solder bump joint and join together the substrate having pads and the top die. The solder bumps form lamellar structures and have a contact angle of less than 90°.

According to some embodiments, a method of mitigating early electromigration failure includes heating a solder bump above a melting temperature of the solder bump. The solder bump is predominantly a eutectic Sn compound that includes at least one of Cu, Ag, Bi, Pb, Au, and Ni. The solder bump is stretched to increase the height of the solder bump. The solder bump is cooled down to form a contact angle of less than 90°. The solder bump has a lamellar structure that is predominantly orthogonal to an axis of stretching, and a ratio of an average center width spacing to an average top contact width spacing is between 0.5 and 1.0.

Figure 13A:
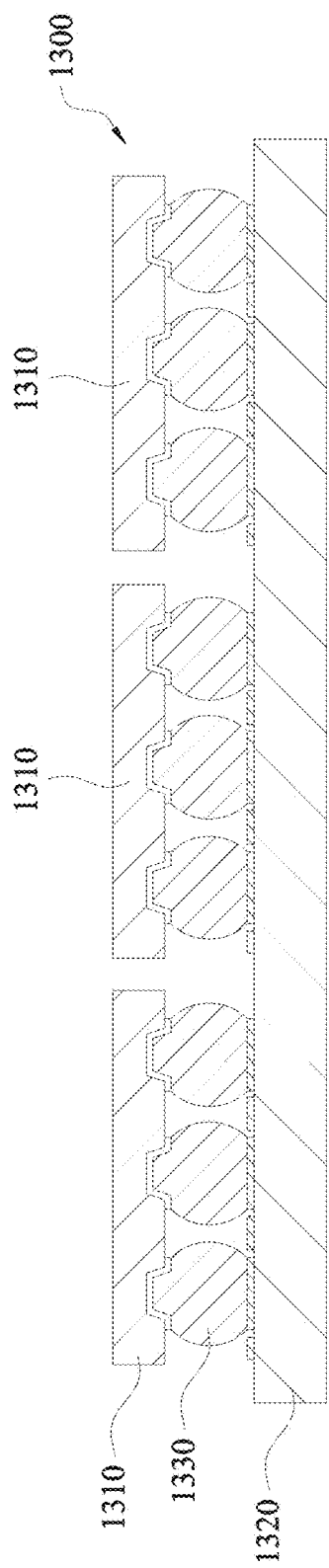
FIGS. 13A-13D are cross-sectional diagrams of a package during various stages of a wafer-level pulling method in accordance with some embodiments.

FIG. 13A is a cross-sectional diagram of a package 1300 at a beginning of a wafer-level pulling method in accordance with some embodiments. In some embodiments, the wafer-level pulling describes a pulling process applied to multiple chips. Package 1300 includes a plurality of chips 1310 bonded to a wafer 1320 by solder bumps 1330. In some embodiments, package 1300 is part of a three-dimensional integrated circuit (3DIC). In some embodiments, package 1300 is an intermediate structure prior to singulation of at least one chip 1310 and a corresponding portion of wafer 1320.

The plurality of chips 1310 is usable to perform select functions. In some embodiments, each chip 1310 is the same. In some embodiments, at least one chip 1310 is different from at least one other chip 1310. In some embodiments, chips 1310 are arranged in a regular pattern over wafer 1320. In some embodiments, chips 1310 are arranged in an irregular manner across wafer 1320. Package 1300 includes three chips 1310. In some embodiments, package 1300 includes two chips 1310. In some embodiments, package 1300 includes more than three chips 1310. In some embodiments, package 1300 includes at least 1000 chips 1310.

In some embodiments, wafer 1320 includes active devices or passive devices. In some embodiments, wafer 1320 is an interposer.

Solder bumps 1330 electrically connect chips 1310 to wafer 1320. In some embodiments, at least one solder bump 1330 is connected to a corresponding chip 1310 through at least one under bump metallurgy (UBM) layer. In some embodiments, at least one solder bump 1330 is connected to wafer 1320 by a contact pad.

Figure 13B:
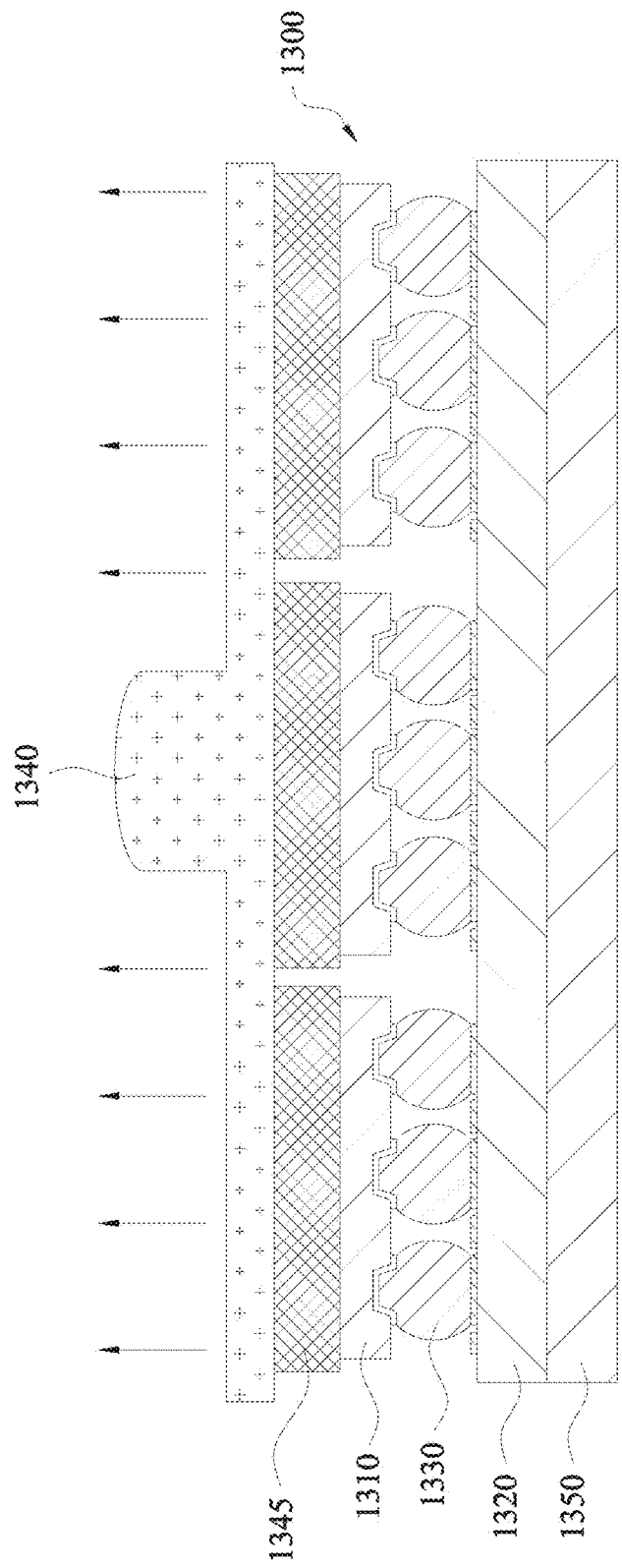

FIG. 13B is a cross-sectional diagram of package 1300 at an intermediate stage of a wafer-level pulling method in accordance with some embodiments. A top holder 1340 is attached to chips 1310. Top holder 1340 includes a plurality of bonder heads 1345 for connecting to chips 1310 during the wafer-level pulling method. Each bonder head 1345 connects to a corresponding chip 1310. A bottom holder 1350 is attached to wafer 1320. During operation, bonder heads 1345 are attached to chips 1310 using a vacuum. In some embodiments, bonder heads 1345 are attached to chips 1310 using an adhesive layer which is decomposable using ultraviolet (UV) radiation or thermal radiation. Bottom holder 1350 is attached to wafer 1320 using a vacuum. In some embodiments, bottom holder 1350 is attached to wafer 1320 using an adhesive layer which is decomposable using UV radiation or thermal radiation.

Heat is applied to package 1300 in order to soften solder bumps 1330 to permit stretching of the solder bumps during the wafer-level pulling. In some embodiments, the heat is applied using a heated gaseous flow. In some embodiments, the gaseous flow includes nitrogen gas, argon, helium or another inert gas. In some embodiments, heat is applied using an electrical wire embedded in at least one of top holder 1340 or bottom holder 1350. In some embodiments, the electrical wire is embedded in each bonder head 1345 in order to facilitate individual heating of a corresponding chip 1310. The individual heating helps to facilitate even heating across package 1300. Uniform heating helps to ensure uniform stretching of solder bumps 1330 during the wafer-level pulling. Uniform stretching of solder bumps 1330 increases a yield of the wafer-level pulling which reduces production costs. In some embodiments, the heat is applied using a thermal radiation device, such as an infrared (IR) light source, a laser or another suitable thermal radiation device. In some embodiments, targeted laser heating is used for local heating adjustments within package 1300 to facilitate even heating across the package.

Once the solder bumps 1330 reach a softened state, top holder 1340 translates in order to increase a distance between the top holder and bottom holder 1350. In some embodiments, top holder 1340 is translated using a piezo-electric device, a rack and pinion device, a threaded device, a piston device or another suitable device. A direction of translation is substantially perpendicular to a top surface of wafer 1320 in order to reduce a risk of bridging between neighboring solder bumps 1330. A rate of stretching is constant across package 1300 in order to maintain uniform stretching of solder bumps 1330 and increase yield of the wafer-level pulling.

Figure 13C:
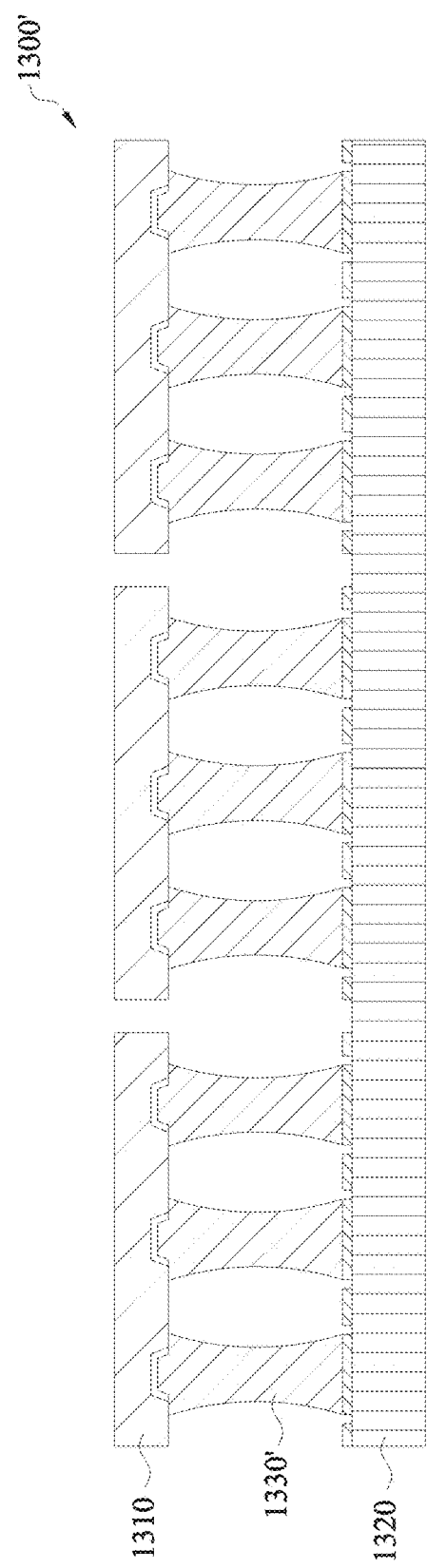

FIG. 13C is a cross-sectional diagram of package 1300' after stretching a wafer-level pulling method in accordance with some embodiments. Package 1300' is similar to package 1300 (FIG. 13A) except that package 1300' includes stretched solder bumps 1330'. In some embodiments, stretched solder bumps 1330' are similar to solder bump 108 of FIG. 1E, solder bump 108 of FIG. 3, solder bump 108 of FIG. 4D, solder bump 508 of FIGS. 5A and 5B, solder bump 608 of FIGS. 6A and 6B, solder bump 708 of FIG. 7, solder bump 808 of FIG. 8, or solder bump 908 of FIGS. 9A and 9B.

In some embodiments, a duration of the wafer-level pulling ranges from about 10 minutes to about 15 minutes. In some embodiments, a rate of heating for wafer-level pulling is less than a rate of heating for chip level pulling such as in FIGS. 1A-1E. Despite a lower rate of heating, a throughput using wafer-level pulling is higher than a throughput for chip level pulling, in some embodiments. For example, on a wafer having 1000 chips the wafer-level pulling is able to stretch the solder bumps of all 1000 chips in a single pulling method. In contrast, chip level pulling would be performed 1000 times in order to stretch the solder bumps for a same number of chips. In some embodiments, a duration of heating for chip level pulling is about 3 minutes to about 5 minutes. Thus, wafer-level pulling decreases an amount of time to stretch the solder bumps for all 1000 chips from a range of about 3000 minutes to about 5000 minutes down to a range of about 10 minutes to about 15 minutes.

In some embodiments, stretched solder bumps 1330' are cooled using a cooling gas, such as nitrogen, argon, helium or another suitable cooling gas. In some embodiments, stretched solder bumps 1330' are cooled using a cooling element in top holder 1340 or bottom holder 1350. In some embodiments, at least one bonder head 1345 includes a cooling element in order to locally control cooling of stretched solder bumps 1330'. In some embodiments, the cooling element includes a heat exchanger, a refrigeration system or another suitable cooling element.

In some embodiments, a control system is connected to heating or cooling elements within top holder 1340, bottom holder 1350 or bonder heads 1345 in order to increase uniformity of a heating or cooling process. The control system receives a signal related to a temperature of solder bumps 1330 or stretched solder bumps 1330' and provides a signal to at least one heating or cooling element in order to adjust a temperature of at least one solder bump 1330 or stretched solder bump 1330'. In some embodiments, the signal related to a temperature of the solder bump 1330 or stretched solder bump 1330' is generated by a temperature monitoring device, such as a laser thermometer, an infrared sensor, or another suitable temperature monitoring device. In some embodiments, the control system is capable of individually controlling the heating or cooling elements within different bonder heads 1345.

Figure 13D:
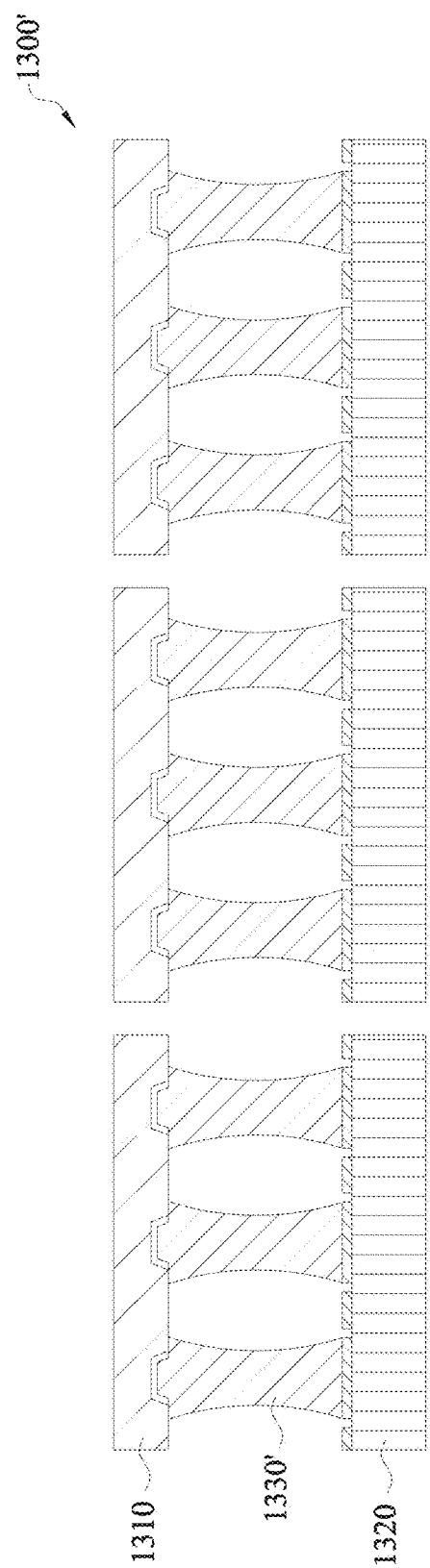

FIG. 13D is a cross-sectional diagram of package 1300' at after singulating in a wafer-level pulling method in accordance with some embodiments. Package 1300 is singulated such that each chip 1310 and a corresponding portion of wafer 1320 are separated from each other. In some embodiments, more than one chip 1310 remains together following singulation. The singulated chips 1310 are connectable to other devices to form a 3DIC or another type of integrated circuit.

In order to increase uniformity of stretching of solder bumps 1330, top holder 1340 includes levelling elements.

Figure 14A:
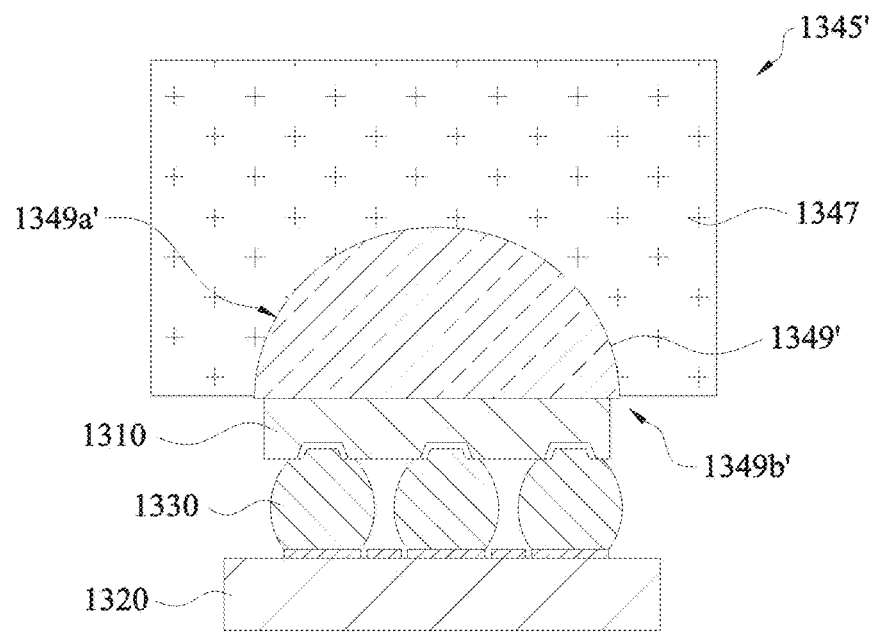
FIGS. 14A-14C are cross-sectional diagrams of a portion of a package during a wafer-level pulling method in accordance with some embodiments.

FIG. 14A is a cross-sectional diagram of a portion of package 1300 during a wafer-level pulling method in accordance with some embodiments. Package 1300 in FIG. 14A is similar to the package of FIG. 13B and same elements have a same reference number. In comparison with FIG. 13B, package 1300 in FIG. 14A includes a stationary portion 1347 and a levelling device 1349' in bonder head 1345'. FIG. 14A includes a single bonder head 1345'; however, top holder 1340 includes a plurality of bonder heads 1345', in some embodiments.

Levelling device 1349' has a rounded surface 1349a' within stationary portion 1347'. A flat surface 1349b' of levelling device 1349' is configured to engage with chip 1310. In some embodiments, levelling device 1349' has a hemispherical shape. In some embodiments, levelling device 1349' has a shape other than a hemispherical shape. During wafer-level pulling, top holder 1340 having bonder head 1345' is lowered onto chip 1310. Levelling device 1349' is capable of rotating within stationary portion 1347' during this time. Due to the ability to rotate, levelling device 1349' will be positioned so that flat surface 1349b' is level with chip 1310.

A vacuum is then applied to secure top holder 1340 to chip 1310. The vacuum locks levelling device 1349' in place so that the levelling device does not rotate with respect to stationary portion 1347. Because flat surface 1349b' was previously leveled with respect to chip 1310, during softening and stretching of solder bumps 1330 chip 1310 remains level, which in turn increases uniformity of stretching of solder bumps 1330.

Figure 14B:
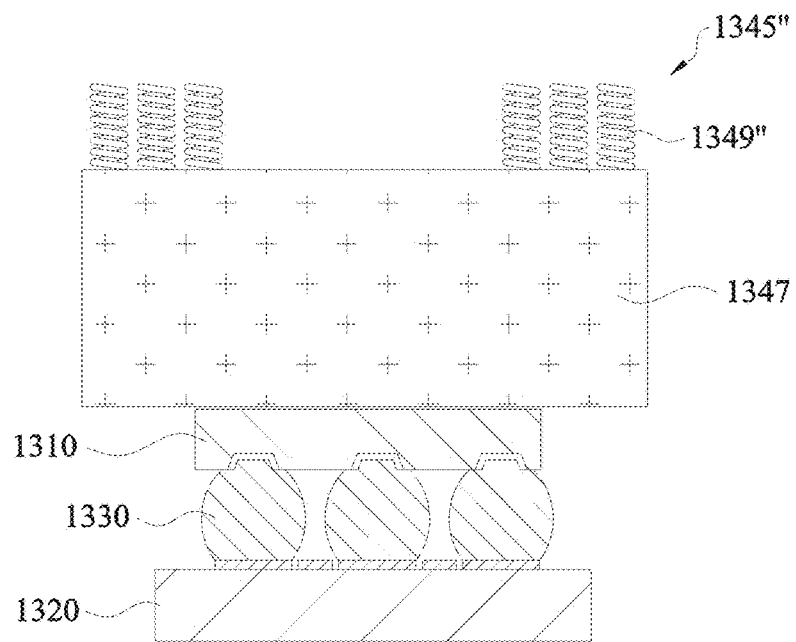

FIG. 14B is a cross-sectional diagram of a portion of package 1300 during a wafer-level pulling method in accordance with some embodiments. Package 1300 in FIG. 14B is similar to the package of FIG. 13B and same elements have a same reference number. In comparison with FIG. 13B, package 1300 in FIG. 14B includes a stationary portion 1347 and a levelling device 1349" on bonder head 1345". FIG. 14B includes a single bonder head 1345"; however, top holder 1340 includes a plurality of bonder heads 1345", in some embodiments.

Levelling device 1349" includes a plurality of elastic deformable elements. In some embodiments, the elastic deformable elements include springs, compression pads, or other suitable elements. Levelling device 1349" is located on a surface of bonder head 1345" opposite chip 1310. Levelling device 1349" helps maintain bonder head 1345" substantially parallel to a top surface of chip 1310 during softening and stretching of solder bumps 1330.

During wafer-level pulling, levelling device 1349" uses elastic force to maintain a uniform distance between a top surface of bonder head 1345" and top holder 1340, which helps to improve uniformity of stretching of solder bumps 1330.

Figure 14C:
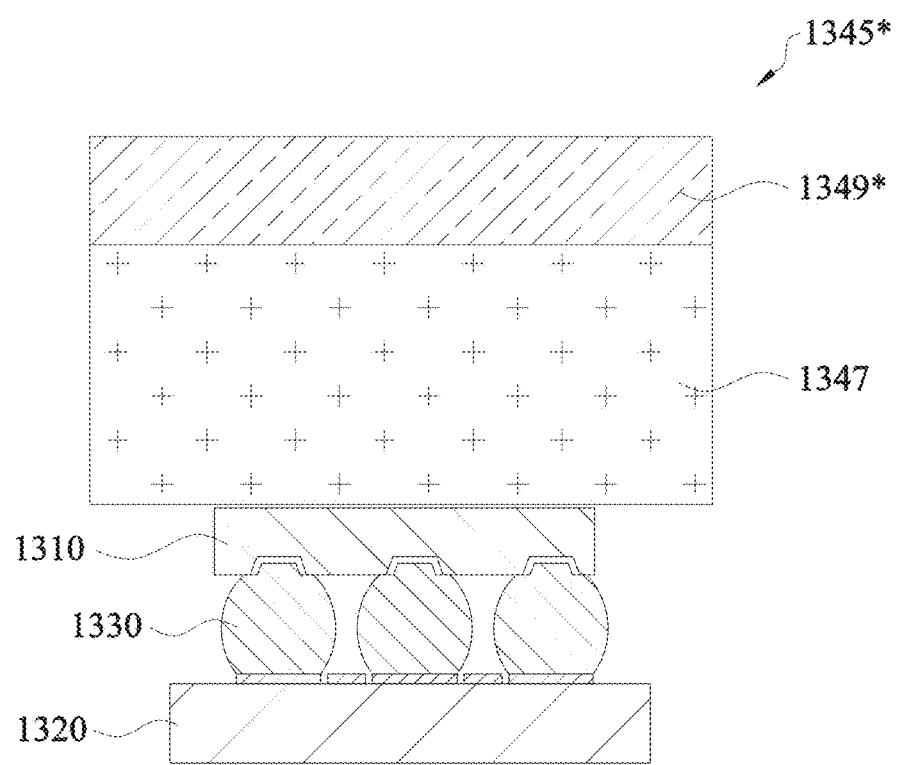

FIG. 14C is a cross-sectional diagram of a portion of package 1300 during a wafer-level pulling method in accordance with some embodiments. Package 1300 in FIG. 14C is similar to the package of FIG. 13B and same elements have a same reference number. In comparison with FIG. 13B, package 1300 in FIG. 14C includes a stationary portion 1347 and a levelling device 1349\* on bonder head 1345\*. FIG. 14C includes a single bonder head 1345\*; however, top holder 1340 includes a plurality of bonder heads 1345\*, in some embodiments.

Levelling device 1349\* includes a continuous elastic layer. In some embodiments, the continuous elastic layer includes polymers, resins or another suitable elastic material. Levelling device 1349\* is located on a surface of bonder head 1345\* opposite chip 1310. Levelling device 1349\* helps maintain bonder head 1345\* substantially parallel to a top surface of chip 1310 during softening and stretching of solder bumps 1330.

During wafer-level pulling, levelling device 1349\* uses elastic force to maintain a uniform distance between a top surface of bonder head 1345\* and top holder 1340, which helps to improve uniformity of stretching of solder bumps 1330.

In some embodiments, top holder 1340 includes bonder heads having all the same levelling devices, e.g., levelling device 1349', levelling device 1349", or levelling device 1349\*. In some embodiments, top holder 1340 includes at least one bonder head having a first type of levelling device, e.g., levelling device 1349', levelling device 1349", or levelling device 1349\*, and at least one bonder head having a second type of levelling device, e.g., levelling device 1349', levelling device 1349", or levelling device 1349\*. In some embodiments, a type of levelling device is determined based on a distance from a center of top holder 1340. For example, in some embodiments, bonder heads in a central portion of top holder include levelling device 1394\*; bonder heads in an intermediate portion of the top holder include levelling device 1349", and bonder heads in a peripheral portion of the top holder include levelling device 1345'. In some embodiments, top holder 1340 includes at least one bonder head which does not include a levelling device. In some embodiments, bonder heads in a central portion of top holder 1340 are free of levelling devices and bonder heads in a peripheral portion of the top holder include levelling devices, e.g., levelling device 1349', levelling device 1349", or levelling device 1349\*.

One aspect of this description relates to a wafer-level pulling method. The method includes securing a top holder to a plurality of chips. The method further includes securing a bottom holder to a wafer, wherein the plurality of chips are bonded to the wafer by a plurality of solder bumps. The method further includes softening the plurality of solder bumps. The method further includes stretching the plurality of softened solder bumps, wherein stretching the plurality of softened solder bumps comprises leveling the plurality of chips using a plurality of levelling devices separated from the plurality of chips, and a first levelling device of the plurality of levelling devices has a different structure from a second levelling device of the plurality of levelling devices. In some embodiments, securing the top holder to the plurality of chips includes securing the top holder to the plurality of chips using a plurality of bonder heads, and each bonder head of the plurality of bonder heads is secured to a corresponding chip of the plurality of chips. In some embodiments, securing the top holder to the plurality of chips includes securing the top holder to the plurality of chips using a plurality of bonder heads, and each bonder head of the plurality of bonder heads comprises a corresponding levelling device of the at least one levelling device. In some embodiments, securing the top holder to the plurality of chips comprises securing the top holder to the plurality of chips using a plurality of bonder heads, a first bonder head of the plurality of bonder heads includes the first levelling device, and a second bonder head of the plurality of bonder heads includes the second levelling device. In some embodiments, securing the top holder to the plurality of chips includes securing the top holder to the plurality of chips using a plurality of bonder heads, and a first bonder head of the plurality of bonder heads includes the first levelling device positioned between the first bonder head and the top holder. In some embodiments, securing the top holder to the plurality of chips includes securing the top holder to the plurality of chips using a plurality of bonder heads, and a first bonder head of the plurality of bonder heads includes the first levelling device, and the first levelling device is configured to rotate with respect to a stationary portion of the at least one bonder head. In some embodiments, securing the top holder to the plurality of chips includes securing the top holder to the plurality of chips using a plurality of bonder heads, and a first bonder head of the plurality of bonder heads comprises the first levelling device, a third bonder head of the plurality of bonder heads includes a third levelling device of the plurality of levelling devices, and the third levelling device has a same structure as the first levelling device. In some embodiments, the method further includes singulating the plurality of chips and the wafer. In some embodiments, a combined duration of the softening of the plurality of solder bumps and the stretching of the plurality of solder bumps ranges from about 10 minutes to about 15 minutes. In some embodiments, softening the plurality of solder bumps includes locally controlling heating of a portion of the plurality of solder bumps. In some embodiments, stretching the plurality of softened solder bumps includes maintaining each chip of the plurality of chips level using a first bonder head comprising the first levelling device and a third bonder head free of all levelling devices. In some embodiments, stretching of plurality of softened solder bumps includes forming the lamellar structure including a Sn-rich phase having greater than 90% Sn.

Another aspect of this description relates to a wafer-level pulling method. The method includes securing a top holder to a plurality of chips, wherein the top holder is secured to the plurality of chips by a plurality of bonder heads, and at least one bonder head of the plurality of bonder heads includes a levelling device. The method further includes securing a bottom holder to a wafer, wherein the plurality of chips is bonded to the wafer by a plurality of solder bumps. The method further includes softening the plurality of solder bumps. The method further includes stretching the plurality of softened solder bumps, wherein stretching the plurality of softened solder bumps includes maintaining a chip of the plurality of chips secured to the at least one bonder head level with respect to the wafer using a plurality of distinct levelling devices separated from the plurality of chips. In some embodiments, the method further includes singulating the plurality of chips having the stretched plurality of solder bumps. In some embodiments, stretching the plurality of softened solder bumps includes maintaining each chip of the plurality of chips level using a first set of bonder heads of the plurality of bonder heads including a first levelling device and a second set of bonder heads of the plurality of bonder heads including a second levelling device different from the first levelling device, and at least one of the first levelling device or the second levelling device is configured to rotate. In some embodiments, stretching of the plurality of softened solder bumps includes forming the lamellar structure including a Sn-rich phase having greater than 90% Sn.

Still another aspect of this description relates to a wafer-level pulling method. The method includes securing a top holder to a plurality of chips, wherein a first chip of the plurality of chips is secured to the top holder by a first levelling device having a first structure, a second chip of the plurality of chips is secured to the top holder by a second levelling device having a second structure different from the first structure, and a third chip of the plurality of chips is secured to the top holder without an intervening levelling device. The method further includes securing a bottom holder to a wafer, wherein the plurality of chips are bonded to the wafer by a plurality of solder bumps. The method further includes softening the plurality of solder bumps. The method further includes stretching the plurality of softened solder bumps. In some embodiments, the stretching of the plurality of softened solder bumps includes forming the lamellar structure including a Sn-rich phase having greater than 90% Sn. In some embodiments, securing of the top holder to the plurality of chips includes securing the first chip to the top holder using the first levelling device configured to rotate relative to the top holder. In some embodiments, securing of the top holder to the plurality of chips includes securing the first chip to the top holder using the first levelling device including a plurality of springs.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A wafer-level pulling method, the method comprising:
   securing a top holder to a plurality of chips;
   securing a bottom holder to a wafer, wherein the plurality of chips are bonded to the wafer by a plurality of solder bumps;
   softening the plurality of solder bumps; and
   stretching the plurality of softened solder bumps, wherein stretching the plurality of softened solder bumps comprises leveling the plurality of chips using a plurality of levelling devices separated from the plurality of chips, and a first levelling device of the plurality of levelling devices has a different structure from a second levelling device of the plurality of levelling devices.

2. The method of claim 1, wherein the securing of the top holder to the plurality of chips comprises securing the top holder to the plurality of chips using a plurality of bonder heads, and each bonder head of the plurality of bonder heads is secured to a corresponding chip of the plurality of chips.

3. The method of claim 1, wherein the securing of the top holder to the plurality of chips comprises securing the top holder to the plurality of chips using a plurality of bonder heads, and each bonder head of the plurality of bonder heads comprises a corresponding levelling device of the at least one levelling device.

4. The method of claim 1, wherein the securing of the top holder to the plurality of chips comprises securing the top holder to the plurality of chips using a plurality of bonder heads, a first bonder head of the plurality of bonder heads comprises the first levelling device, and a second bonder head of the plurality of bonder heads comprises the second levelling device.

5. The method of claim 1, wherein the securing of the top holder to the plurality of chips comprises securing the top holder to the plurality of chips using a plurality of bonder heads, and a first bonder head of the plurality of bonder heads comprises the first levelling device positioned between the first bonder head and the top holder.

6. The method of claim 1, wherein the securing of the top holder to the plurality of chips comprises securing the top holder to the plurality of chips using a plurality of bonder heads, and a first bonder head of the plurality of bonder heads comprises the first levelling device, and the first levelling device is configured to rotate with respect to a stationary portion of the at least one bonder head.

7. The method of claim 1, wherein the securing of the top holder to the plurality of chips comprises securing the top holder to the plurality of chips using a plurality of bonder heads, and a first bonder head of the plurality of bonder heads comprises the first levelling device, a third bonder head of the plurality of bonder heads comprises a third levelling device of the plurality of levelling devices, and the third levelling device has a same structure as the first levelling device.

8. The method of claim 1, further comprising singulating the plurality of chips and the wafer.

9. The method of claim 1, wherein a combined duration of the softening of the plurality of solder bumps and the stretching of the plurality of solder bumps ranges from about 10 minutes to about 15 minutes.

10. The method of claim 1, wherein the softening of the plurality of solder bumps comprises locally controlling heating of a portion of the plurality of solder bumps.

11. The method of claim 1, wherein the stretching of the plurality of softened solder bumps comprises maintaining each chip of the plurality of chips level using a first bonder head comprising the first levelling device and a third bonder head free of all levelling devices.

12. The method of claim 1, wherein the stretching of the plurality of softened solder bumps comprises forming the lamellar structure including a Sn-rich phase having greater than 90% Sn.

13. A wafer-level pulling method, the method comprising:
    securing a top holder to a plurality of chips, wherein the top holder is secured to the plurality of chips by a plurality of bonder heads, and at least one bonder head of the plurality of bonder heads comprises a levelling device;
    securing a bottom holder to a wafer, wherein the plurality of chips is bonded to the wafer by a plurality of solder bumps;
    softening the plurality of solder bumps; and
    stretching the plurality of softened solder bumps, wherein stretching the plurality of softened solder bumps comprises maintaining a chip of the plurality of chips secured to the at least one bonder head level with respect to the wafer using a plurality of distinct levelling devices separated from the plurality of chips.

14. The method of claim 13, further comprising singulating the plurality of chips having the stretched plurality of solder bumps.

15. The method of claim 13, wherein the stretching of the plurality of softened solder bumps comprises maintaining each chip of the plurality of chips level using a first set of bonder heads of the plurality of bonder heads comprising a first levelling device and a second set of bonder heads of the plurality of bonder heads comprising a second levelling device different from the first levelling device, and at least one of the first levelling device or the second levelling device is configured to rotate.

16. The method of claim 13, wherein the stretching of the plurality of softened solder bumps comprises forming the lamellar structure including a Sn-rich phase having greater than 90% Sn.

17. A wafer-level pulling method, the method comprising:
    securing a top holder to a plurality of chips, wherein a first chip of the plurality of chips is secured to the top holder by a first levelling device having a first structure, a second chip of the plurality of chips is secured to the top holder by a second levelling device having a second structure different from the first structure, and a third chip of the plurality of chips is secured to the top holder without an intervening levelling device;
    securing a bottom holder to a wafer, wherein the plurality of chips are bonded to the wafer by a plurality of solder bumps;
    softening the plurality of solder bumps; and
    stretching the plurality of softened solder bumps.

18. The method of claim 17, wherein the stretching of the plurality of softened solder bumps comprises forming the lamellar structure including a Sn-rich phase having greater than 90% Sn.

19. The method of claim 17, wherein the securing of the top holder to the plurality of chips comprises securing the first chip to the top holder using the first levelling device configured to rotate relative to the top holder.

20. The method of claim 17, wherein the securing of the top holder to the plurality of chips comprises securing the first chip to the top holder using the first levelling device comprising a plurality of springs.

* * * * *